(12) United States Patent
Tokai et al.

(10) Patent No.: US 6,312,864 B1
(45) Date of Patent: *Nov. 6, 2001

(54) METHODS FOR PRODUCTION OF PATTERNED CALCINED INORGANIC FILM

(75) Inventors: Hiroyuki Tokai, Wako; Kazunobu Fukushima, Saitama-ken; Osamu Kawana; Nobuyuki Suzuki, both of Tsurugashima; Hideaki Kojima, Kawagoe; Tsuyoshi Mitani, Tsurugashima; Kouichi Takagi, Kawagoe, all of (JP)

(73) Assignee: Taiyo Ink Manufacturing Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/557,089

(22) Filed: Apr. 21, 2000

Related U.S. Application Data

(62) Division of application No. 09/181,806, filed on Oct. 29, 1998, now Pat. No. 6,120,975.

(30) Foreign Application Priority Data

Nov. 4, 1997 (JP) .................................................. 9-316644

(51) Int. Cl.$^7$ .............................. H01J 9/24; H01J 17/16; B32B 31/26
(52) U.S. Cl. .......................... 430/198; 430/330; 427/226; 445/24
(58) Field of Search ................................ 430/198, 321, 430/315, 311, 319, 330; 445/24; 427/226

(56) References Cited

U.S. PATENT DOCUMENTS

| | | | |
|---|---|---|---|
| 4,420,501 | * 12/1983 | Veda et al. | 427/54.1 |
| 5,116,271 | * 5/1992 | Arimoto | 445/24 |
| 5,909,083 | * 6/1999 | Asano et al. | 313/584 |
| 6,120,975 | * 9/2000 | Tokai et al. | 430/321 |

FOREIGN PATENT DOCUMENTS

| | | |
|---|---|---|
| 60-221381 | * 11/1985 | (JP) . |
| 2-124744 | 5/1990 | (JP) . |
| 5-67405 | 3/1993 | (JP) . |
| 5-94716 | 4/1993 | (JP) . |
| 6-56461 | 3/1994 | (JP) . |
| 8-55575 | 2/1996 | (JP) . |
| 8-171863 | 7/1996 | (JP) . |
| 8-227153 | 9/1996 | (JP) . |
| 9-142878 | 6/1997 | (JP) . |

* cited by examiner

Primary Examiner—John A. McPherson
(74) Attorney, Agent, or Firm—Ronald P. Kananen; Rader, Fishman & Grauer

(57) ABSTRACT

Disclosed is a method for producing a patterned calcined inorganic film such as an electroconducting or insulating (non-conductive) film, particularly a plasma display panel, embracing a calcining step. To produce a patterned calcined inorganic film without inducing warpage, shrinkage of line width, or breakage of patterned lines, a patterned film formed on a substrate with a composition containing a heat decomposable binder and particles of an inorganic material is covered, prior to the calcining step, with a coating film of a heat decomposable resin composition capable of hardening or drying at a temperature lower than the temperature at which the heat decomposable binder is thermally decomposed and further capable of being burned off below the highest temperature of the calcining profile and thereafter the calcining step is performed.

10 Claims, 5 Drawing Sheets

METHODS FOR PRODUCTION OF PATTERNED CALCINED INORGANIC FILM

This application is a divisional of application Ser. No 09/181,806 filed Oct. 29, 1998, now U.S. Pat. No. 6,120,975.

BACKGROUND OF THE INVENTION

1. Field of the Invention

This invention relates to methods for the production of a patterned calcined inorganic film and a plasma display panel. More particularly, this invention relates to a technique for calcining a patterned film without inducing warpage, shrinkage of line width, etc. in the formation of a circuit on a ceramic substrate, the manufacture of a photoelectric tube, the manufacture of an electroconductive film or an insulating film on the front substrate or the back substrate of a plasma display panel, and the formation of a fluorescent film.

2. Description of the Prior Art:

In recent years, the demand for conductor circuit patterns of increased density and heightened fineness has been escalating in the field of circuit substrates, displays, and the like. As a result, the desirability of developing a patterning technique which is capable of forming highly fine patterns with high reliability has been finding recognition.

When a patterned calcined inorganic film is produced by using a composition containing a heat decomposable binder and particles of an inorganic material, forming on a substrate a patterned film of the composition by the printing technique or photolithographic technique, and calcining this film thereby burning off the heat decomposable binder, there arises a peculiar problem which is attendant on the operation of calcination. Now, this problem will be explained below with reference to a plasma display panel (hereinafter abbreviated as "PDP"), for example.

The PDP is a planar display for exhibiting pictures and pieces of information by utilizing the light emitted by plasma discharge. It is classified under the DC type and the AC type according to the structure of panel and the mode of driving. The principle of color display by the PDP consists in generating plasma discharge in cells (discharge spaces) between two opposed electrodes severally formed on a front glass substrate and a back glass substrate separated by intervening ribs (barriers), and exciting the phosphor formed on the inner surface of the back glass substrate with the ultraviolet light generated by the discharge of such a gas as He or Xe sealed in the cells thereby inducing generation of visible lights of three primary colors. The cells in the DC type PDP are divided by the component ribs of a lattice, whereas those in the AC type PDP are divided by the ribs which are parallelly arranged on the face of the substrate. In either case, the cells are divided by ribs.

FIG. 1 illustrates a typical construction of the planar discharge type PDP using a three-electrode structure for full color display. On the lower face of a front glass substrate 1, many pairs of display electrodes 2a, 2b each comprising a transparent electrode 3a or 3b intended for discharge and a bus electrode 4a or 4b intended for lowering the line resistance of the transparent electrode are formed. On the display electrodes 2a, 2b, a transparent dielectric layer 5 (low melting glass) for accumulating electric charge is formed by printing and calcination. A protective layer (MgO) 6 is formed thereon by vacuum deposition. The protective layer 6 assumes the role of protecting the display electrodes and maintaining the state of discharge.

On a back glass substrate 7, ribs (barriers) 8 shaped like stripes and adapted to partition discharge spaces and address electrodes (data electrodes) 9 severally disposed in the discharge spaces are formed with prescribed pitches. On the inner faces of discharge spaces, fluorescent films of the three colors, i.e. red (10a), blue (10b), and green (10c), are laid out regularly. In the full color display, the fluorescent films of the three primary colors of red, blue, and green mentioned above jointly form one picture element.

The PDP described above is called a "planar discharge system" because an AC pulse voltage is applied between the pair of display electrodes 2a, 2b to induce discharge between the electrodes on one and the same substrate. It has a construction such that the ultraviolet light generated by discharge excites the fluorescent films 10a, 10b, and 10c of the back substrate 7 and the visible light consequently generated is seen through the transparent electrodes 3a, 3b of the front substrate 1 (reflection type).

The formation of the bus electrodes 4a, 4b mentioned above has been heretofore attained by a process which comprises forming three Cr/Cu/Cr layers by vacuum deposition or sputtering on the transparent electrode and then patterning the layers by the photolithographic technique. Since this process suffers copiousness of component steps and high cost of production, in recent years, a process which comprises screen printing a conductive paste such as of silver and then calcining the layer of the paste or, for the purpose of imparting to a pattern a line width of not more than 150 $\mu$m, a process which comprises applying a photosensitive conductive paste to the transparent electrode, exposing the layer of the paste to light through a pattern mask, developing the exposed layer, and subsequently calcining the developed layer has come to take the place of the former process.

The calcining step, however, has encountered the problem of exposing the bus electrodes 4a, 4b to warpage, as shown in FIG. 2, to shrinkage of line width, and to accidental breakage. Not only when the breakage of electrode lines occurs but also when the shrinkage of line width occurs, the problem arises that the PDP ceases to operate normally because the bus electrodes are no longer capable of accomplishing the primary object thereof to lower the line resistance of the transparent electrodes 3a, 3b. When the bus electrodes 4a, 4b develops warpage, the problem ensues that the bus electrodes become liable to cause a short circuit because the dielectric layer on the warped parts of the bus electrodes suffers a decrease in thickness.

The problem of entailing the warpage, shrinkage of line width, and breakage of electrode lines subsequent to the calcination mentioned above occurs not only in the bus electrodes 4a, 4b but also in the address electrodes 9.

The address electrodes 9 are manufactured by forming a patterned layer of an electroconductive paste containing an electroconductive power of Ag, Au, Pd, Ni, Cu, Al, Pt, or the like on the back glass substrate 7 and calcining the layer at a temperature in the approximate range of 500° C. to 600° C. For the formation of the pattern of the electroconductive paste, the printing method, the lift-off method (the method which comprises laminating a photosensitive dry film onto a substrate throughout the whole surface thereof, patterning the film on the substrate, filling up grooves opened in the film with an electroconductive paste, drying and hardening the paste, then removing the dry film, and calcining the hardened paste; otherwise called "dry film filling method"), and the method of patterning a photosensitive electroconductive paste by photolithography (the method which comprises applying a photosensitive electroconductive paste to a substrate, drying the applied layer of the paste, exposing the dry layer to light through a pattern mask, developing the exposed areas, and calcining the developed layer) are adopted. The address electrodes likewise suffer the problem of encountering such difficulties as warpage, shrinkage of line width and breakage of electrode lines during the course of calcination and preventing the PDP from normally operating.

The problems to be encountered in the manufacture of a conductor pattern as described above are not limited to the PDP. They also occur in various other operations such as, for example, forming a circuit by forming a patterned circuit of an electrodoncuctive paste or photosensitive conductive paste on a ceramic substrate and calcining the patterned circuit and forming a conductor pattern through a calcining step as in the manufacture of a photoelectric tube.

They occur not only in the formation of a conductor pattern but also in the formation of a nonconductor (insulator) pattern. In the PDP mentioned above, for example, the formation of ribs (barriers) is effected by the printing method which comprises performing the work of printing and drying a glass paste by screen printing on a glass substrate up to eight–ten-odds repetitions till the superposed layers in a prescribed pattern amount to a prescribed thickness (about 100–150 μm) and then calcining the superposed layers of glass paste; the sandblasting method which comprises applying glass paste to a glass substrate throughout the entire surface till a prescribed thickness, scraping out grooves in the layer of glass paste to a prescribed pattern by blowing blast powder thereto through a pattern mask formed by photolithography and vested with an ability to resist blasting, and then calcining the patterned layer; and the lift-off method (dry film filling method) which comprises laminating a photosensitive dry film of a prescribed thickness onto a glass substrate, forming grooves in the film by photolithography in the prescribed shape of ribs, applying glass paste so as to fill up the grooves, drying and hardening the glass paste, removing the photosensitive dry film from the substrate, and calcining the glass paste.

The ribs formed on the PDP back substrate are intended to confine the luminous discharge within a fixed area so as to preclude false discharge or cross talk between adjacent discharge cells and ensure ideal display. They are endowed with the function of retaining uniform discharge spaces owing to their own height, width, and pattern gap and enhancing the mechanical strength of the whole panel. In order for the PDP to acquire high luminance, it is necessary that the discharge gas spaces be as wide as permissible and the ribs be as thin as possible. Specifically, it is necessary to form ribs which have a large aspect ratio (ratio of height to width), a narrow width, a great height, and fully sufficient strength.

When the warpage or the shrinkage of line width occurs during the course of calcining ribs mentioned above, the ribs acquire only disfigured skirts and inaccurate heights and the display cells suffer their shape to be heavily affected by blurred borders of the ribs and the panel eventually obtained displays pictures of inferior quality.

When the warpage or the shrinkage occurs in the formation of a fluorescent film, it possibly cause a crack or peeling of the film and impairs the quality of display and degrades the yield.

SUMMARY OF THE INVENTION

In view of such problems as mentioned above, a primary object of the present invention is to provide, for the calcining process involved in the manufacture of a patterned electroconductive or insulating (nonconductive) film, a method which is capable of producing a patterned calcined inorganic film without inducing warpage, shrinkage of line width or brekage of patterned lines.

A further object of the present invention is to provide a method for the production of a PDP, which method is capable of producing a highly fine electroconductive film of bus electrodes or address electrodes, insulating film of ribs or fluorescent film with high accuracy without inflicting warpage, shrinkage of line width or cracks.

To accomplish the objects mentioned above, the first aspect of the present invention provides a method for the production of a patterned calcined inorganic film by performing a calcining operation on a patterned film of a composition containing a heat decomposable binder and particles of an inorganic material formed on a substrate, characterized by the fact that prior to the calcining step mentioned above, the film mentioned above is covered with a coating film of a heat decomposable resin composition capable of hardening or drying at a temperature lower than the temperature at which the heat decomposable binder is thermally decomposed and further capable of being burned off at a temperature not more than the highest temperature of the calcining profile (temperature control profile of the calcining step) and thereafter the calcining step mentioned above is performed.

The second aspect of the present invention provides a method for the production of the PDP by the use of the calcining technique described above.

In the first mode of embodiment of the method for the production of the PDP including the steps of patterning a film of a composition containing a heat decomposable binder and particles of an inorganic material formed on a substrate and calcining the film thereby burning off the heat decomposable binder and consequently forming on the substrate a patterned electroconducting or insulating film made of the inorganic material, the method is characterized by the fact that prior to the calcining step mentioned above, the film mentioned above is covered with a coating film of a heat decomposable resin composition capable of hardening or drying at a temperature lower than the temperature at which the heat decomposable binder is thermally decomposed and further capable of being burned off at a temperature not more than the highest temperature of the calcining profile and thereafter the calcining step mentioned above is performed.

In the second mode of embodiment of the method for the production of the PDP including a film-forming step of forming on a substrate a coating film of a pasty composition containing a heat decomposable binder and particles of an inorganic material and possessing an ability to render itself, on exposure to light, insoluble in a developing solution, an exposing step of selectively exposing the film to light thereby photocuring the exposed portion of the film, a developing step of removing the unexposed portion of the film with a developing solution, and a calcining step of calcining the photocured film together with the substrate thereby burning off the heat decomposable binder in the film and consequently forming on the substrate a patterned electroconducting or insulating film of the inorganic material, the method is characterized by the fact that prior to the calcining step mentioned above, the photocured film is covered with a coating film of a liquid heat decomposable resin composition capable of hardening or drying at a temperature lower than the temperature at which the heat decomposable binder is thermally decomposed and further capable of being burned off at a temperature not more than the highest temperature of the calcining profile and thereafter the calcining step mentioned above is performed.

In the third mode of embodiment of the method for the production of the PDP including a film-forming step of forming on a substrate a coating film of a pasty composition containing a heat decomposable binder and particles of an inorganic material and possessing an ability to render itself, on drying or hardening, susceptible of an abrading work with blast powder (abrasive), a resist-forming step of laminating a blast-resistant photosensitive dry film on the coating film, selectively exposing the photosensitive dry film to light, and then developing the dry film thereby forming a blast-resistant film possessing a prescribed masking pattern, a blasting step of blowing blast powder to the films thereby cutting the portion of the coating film exposed through the blast-resistant film to give a patterned film, a peeling step of removing the blast-resistant film with a remover or peeling liquid, and a calcining step of calcining the blast-worked patterned film together with the substrate thereby burning off the heat decomposable binder in the patterned film and consequently forming on the substrate a patterned electro-conducting or insulating film of the inorganic material, the method is characterized by the fact that prior to the calcining step mentioned above, the patterned film mentioned above is covered with a coating film of a liquid heat decomposable resin composition capable of hardening or drying at a temperature lower than the temperature at which the heat decomposable binder is thermally decomposed and further capable of being burned off at a temperature not more than the highest temperature of the calcining profile and thereafter the calcining step mentioned above is performed.

In the fourth mode of embodiment of the method for the production of the PDP including a filling step of applying a pasty composition containing a heat decomposable binder and particles of an inorganic material in a prescribed thickness to a dry film having grooves on a substrate so as to fill up the grooves and drying and hardening the composition, a polishing step of polishing the film of the hardened composition till the dry film appears to the surface, a peeling step of immersing the dry film and the substrate in a remover to swell and peel off the dry film thereby leaving a patterned film of the hardened composition, and a calcining step of calcining the patterned film of the hardened composition together with the substrate thereby burning off the heat decomposable binder in the hardened composition and consequently forming on the substrate a patterned electroconducting or insulating film of the inorganic material, the method is characterized by the fact that prior to the calcining step mentioned above, the patterned film of the hardened composition is covered with a coating film of a liquid heat decomposable resin composition capable of hardening or drying at a temperature lower than the temperature at which the heat decomposable binder is thermally decomposed and further capable of being burned off at a temperature not more than the highest temperature of the calcining profile and thereafter the calcining step mentioned above is performed.

In the fifth mode of embodiment of the method for the production of the PDP including a printing step of forming on a substrate by the screen printing technique a film of a prescribed pattern of a pasty composition containing a heat decomposable binder and particles of an inorganic material and possessing an ability to render itself, on drying or hardening, capable of retaining the shape thereof and a calcining step of calcining the film together with the substrate thereby burning off the heat decomposable binder in the film and forming on the substrate a patterned electro-conducting or insulating film of the inorganic material, the method is characterized by the fact that prior to the calcining step mentioned above, the film of the prescribed pattern is covered with a coating film of a liquid heat decomposable resin composition capable of hardening or drying at a temperature lower than the temperature at which the heat decomposable binder is thermally decomposed and further capable of being burned off at was temperature not more than the highest temperature of the calcining profile and thereafter the calcining step mentioned above is performed.

BRIEF DESCRIPTION OF THE DRAWINGS

Other objects, features, and advantages of the invention will become apparent from the following description taken together with the drawings, in which.

DETAILED DESCRIPTION OF THE INVENTION

Figure 1:
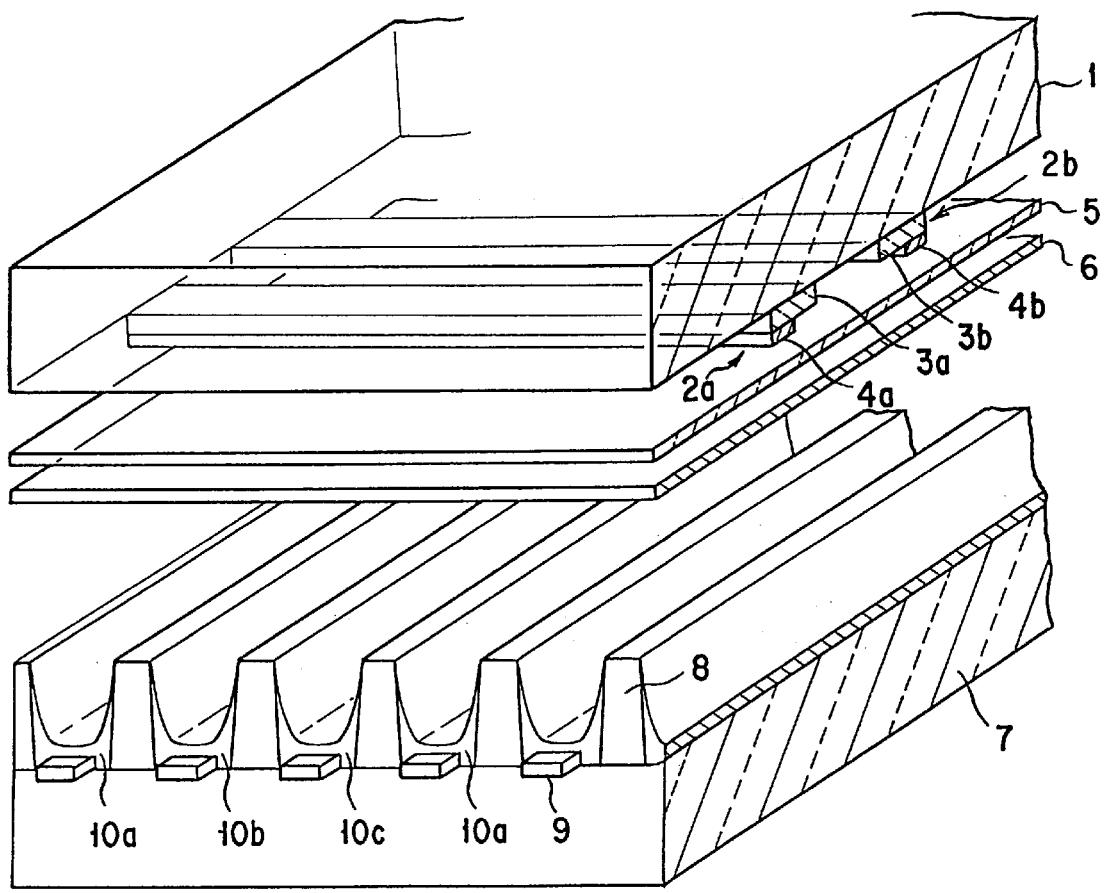
FIG. 1 is a fragmentary exploded perspective view of the AC type PDP of the planar discharge system.
Figure 2:
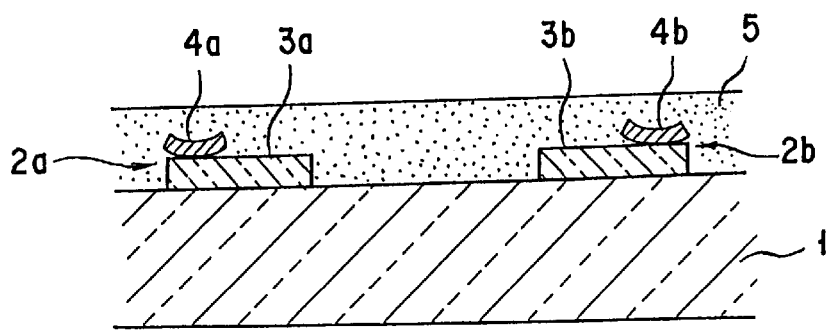
FIG. 2 is a fragmentary sectional side view schematically illustrating the bus electrodes of the front substrate of the PDP in a warped state.

The present inventors have made a diligent study concerning such phenomena as warpage, shrinkage of line width, and breakage of patterned lines which occur in the process of producing a patterned calcined inorganic film by performing a calcining operation on a patterned film formed on a substrate with a composition containing a heat decomposable binder and particles of an inorganic material. They have consequently found that these phenomena occur at the stage of removing the binder by heating the film and not at the stage of calcination. To be specific, the temperature control profile of the calcining step generally consists of two stages, i.e. the stage of heating the film to a high temperature lower than about 500° C. and retaining it at the temperature thereby removing (burning off) the binder from the film and the calcining stage of further heating the film to a temperature not lower than about 500° C. and retaining the film at that temperature. The phenomena mentioned above occur at the stage of removing the binder from the film. It is suspected, therefore, that at the stage of removing the binder from the film, the binder component in the composition is not burned off uniformly throughout the entire web of the film but is burned out preferentially in the surface part of the film and, consequently, the film begins to shrink from the surface part inward and this shrinkage is followed by the warping or the shrinkage of line width. Particularly where the patterning operation performed on the film embraces the step of exposure to light and the step of development, the phenomena mentioned above are liable to occur when the development produces an undercut.

The present inventors, after continuing a diligent study in search of a method capable of preventing the aforementioned phenomena, have discovered that a finely patterned calcined inorganic film can be formed without inducing warpage, shrinkage of line width, or breakage of patterned lines by a method which comprises covering the patterned film mentioned above with a coating film of a heat decomposable resin composition capable of hardening or drying at a temperature lower than the temperature at which the heat decomposable binder mentioned above is thermally decomposed and further capable of being burned off at a temperature not more than the highest temperature of the calcining profile prior to the calcining step mentioned above and thereafter performing the calcining step mentioned above. A coating of the heat decomposable resin composition applied to the patterned film may be dried, thermally cured or photocured prior to the calcining step, depending on the composition used.

This operation may be explained as follows. By having the patterned film coated with a coating film of the heat decomposable resin composition mentioned above prior to the step of calcination, the resin component in the coating film and the binder component in the patterned film are uniformly burned out at the stage of removing the binder. Further, by the coating film, the patterned film is retained fast on the surface of the substrate and prevented from inducing warpage or shrinkage. Since the patterned film is subjected in this state to the removal of the binder and the calcination, the heat decomposable resin in the coating film and the heat decomposable binder in the patterned film are burned off by thermal decomposition and the patterned calcined inorganic film to be consequently produced is free from warpage, shrinkage, or breakage of patterned lines. It is also conceivable that the coating composition intervenes between the patterned lines of the film and, by contacting the end faces thereof and consequently exerting surface tension thereon, contributes to the prevention of the shrinkage.

It is evident from the explanation given above that the present invention can be applied to all the methods that are used for the formation of the patterned calcined inorganic film and does not need to be limited to any specific technical field. The calcined inorganic film may be an electroconducting film or an insulating film, whichever suits the occasion. In the case of an electroconducting film such as for the bus electrodes or address electrodes of the PDP or the conductor circuit of the circuit board, for example, the electroconductive powder of Ag, Au, Pd, Ni, Cu, Al, or Pt and the low melting glass frit having a melting point befitting the calcination temperature are usable for the particles of an inorganic material. In the case of the insulating film such as the ribs in the PDP, the low melting glass frit and the inorganic pigment are usable for the particles. Besides, ceramics such as alumina, silica, zircon, cordierite, and titanium dioxide may be used. The glass frit which is used favorably herein is a low-melting glass having a softening point in the range of 300° to 600° C., preferably containing lead oxide, bismuth oxide, or zinc oxide as a main component and having an average particle diameter of not more than 10 μm.

One preferable example of the PbO-based glass frit is an amorphous frit which is composed of (in percent by weight of oxide basis) 48–82% of PbO, 0.5–22% of $B_2O_3$, 3–32% of $SiO_2$, 0–12% of $Al_2O_3$, 0–10% of BaO, 0–15% of ZnO, 0–2.5% of $TiO_2$, and 0–25% of $Bi_2O_3$ and has a softening point in the range of 420–590° C.

One preferable example of the $Bi_2O_3$-based glass frit is an amorphous frit which is composed of (in percent by weight of oxide basis) 35–88% of $Bi_2O_3$, 5–30% of $B_2O_3$, 0–20% of $SiO_2$, 0–5% of $Al_2O_3$, 1–25% of BaO, and 1–20% of ZnO and has a softening point in the range of 420–590° C.

One preferable example of the ZnO-based glass frit is an amorphous frit which is composed of (in percent by weight of oxide basis) 25–60% of ZnO, 2–15% of $K_2O$, 25–45% of $B_2O_3$, 1–7% of $SiO_2$, 0–10% of $Al_2O_3$, 0–20% of BaO, and 0–10% of MgO and has a softening point in the range of 420–590° C.

The various resins and organic compounds heretofore known to the art are usable for the heat decomposable binder. For the production of the photosensitive paste, the photosensitive organic components (photosensitive prepolymers or photopolymerizable monomers or oligomers) and the photopolymerization initiators or sensitizers are usable. Further, such additives as pigments, dyes, silane coupling agents, leveling agents, and antiblocking agents may be properly incorporated therein, depending on the calcined film aimed at.

The paste to be used for the formation of the patterned film contains a heat decomposable binder and an inorganic material as essensial components. It is used as diluted with a solvent so as to acquire viscosity fit for the intended use. The other components may be property incorporated in the paste to suit the calcined film aimed at. Thus, various species of paste known to the art to be usable for the formation of such calcined inorganic films as disclosed, for example, in published Japanese Patent Application, KOKAI (Early Publication) No. (hereinafter referred to briefly as "JP-A-") 5-94,716, JP-A-5-67,405, JP-A-8-227,153, JP-A-9-142,878, JP-A-6-56,461, JP-A-8-55,575, JP-A-8-171,863, and JP-A-2-124,744 can be adopted. The teachings of the patent specifications mentioned above are hereby incorporated by reference. In the formation of the bus electrodes of the PDP, the procedure which comprises applying by printing a patterned black layer of a silver paste incorporating therein a black pigment for the purpose of imparting contrast, drying the applied layer of the paste, then superposing thereon by printing a white layer of a silver paste for the purpose of lowering the resistance increased in consequence of the addition of the pigment, and subsequently performing the calcining step is popularly adopted besides the procedure which comprises applying by printing only one patterned white layer of a conductor layer such as, for example, a silver paste. Of course, the present invention can be applied to the calcination of such a superposed film as just mentioned.

Preferably, the heat decomposable resin composition for coating the patterned film mentioned above is in a liquid state so as to adhere fast to the film throughout to the corner parts of the edges thereof. The coating film which is formed with this composition has only to be capable of hardening or drying at a temperature lower than the temperature at which the heat decomposable binder succumbs to thermal decomposition and further capable of being burned out by thermal decomposition at a temperature not more than the highest temperature of the calcination profile, but does not need to be limited to any specific type. For the purpose of retaining the sintered particles of an inorganic material in the patterned film fast to the surface of the substrate as long as possible and precluding the occurrence of warpage or shrinkage of line width during the course of calcination, the heat decomposable resin in the coating film is required to possess a heat decomposition temperature substantially equal to or slightly higher than the heat decomposition temperature of the heat decomposable binder mentioned above so that the thermal decomposition occurs substantially at the same time in the resin and the binder.

As the heat decomposable resin composition for use in the present invention, various kinds of resin composition such as drying resin compositions, thermosetting resin compositions, and photocurable resin compositions can be adopted. The term "drying resin composition" as used herein means a resin composition which can form a film in consequence of the expulsion of the solvent by drying. The term "thermosetting resin composition" means a composition which forms a resin film when it is cured by the intermolecular cross-linkage caused by the action of heat or a catalyst. The term "photocurable resin composition" means a composition which forms a resin film when it is cured by the intermolecular cross-linkage caused by the action of such an active ray as ultraviolet light, near infrared rays, infrared rays, or electron rays. A film-forming component (resin, oligomer, or compound) may be solved or dispersed, when necessary, in a solvent and adjusted to a level of viscosity suitable for the method of application, and put to use. The use of the solvent may be omitted when the film-forming component itself is a liquid. The term "heat decomposable resin composition" as used in the present invention means a composition which can form a resin film when it is dried or hardened as mentioned above. The film-forming component itself does not need to be limited to a resin but may be such a compound as, for example, a photopolymerizable monomer.

Where the film-forming component is a resin, the resin may be at least one member selected arbitrarily from among various resins including acrylic polyols, polyvinyl alcohol, polyvinyl acetal, styrene-allyl alcohol resin, phenolic resin, olefinic hydroxyl group-containing polymers, cellulose derivatives such as methyl cellulose, ethyl cellulose, and hydroxyethyl cellulose, ethylene-vinyl acetate copolymer, alkyd resin, alkyd phenol resin, butyral resin, epoxy resin, modified epoxy resin, acrylic resin, polyurethane resin, and polyester resins. Optionally, the resin can be used in combination with a curing catalyst such as a peroxide or acid catalyst. The resin composition is allowed to incorporate therein, as occasion demands, various additives such as organic pigments, plasticizers, antifoaming agents, leveling agents, antoblocking agents, and silane coupling agents.

The film-forming component for the photocurable resin composition may be selected arbitrarily from among various known photosensitive resins (photosensitive prepolymers) such as the resins possessing such ethylenically unsaturated bonds as vinyl group, allyl group, acryloyl group, and methacryloyl group and photosensitve groups such as propargyl group, the acrylic copolymers possessing an ethylenically unsaturated group, for example, in the side chain thereof, the unsaturated carboxylic acid-modified epoxy resin, and the resins formed by adding an anhydrous polybasic acid to the unsaturated carboxylic acid-modified epoxy resin. The compounds possessing at least one ethylenically unsaturated bond in the molecule thereof, namely the photopolymerizable monomers or oligomers, are also usable. Such a photocurable film-forming component is used in combination with a photopolymerization initiator and/or a photopolymerization accelerator. The photopolymerizable monomers among other components mentioned above are mostly in a liquid state and enjoy the advantage of obviating the necessity for an organic solvent.

Typical examples of the photopolymerizable monomers mentioned above include, but are not limited to 2-hydroxyethyl acrylate, 2-hydroxypropyl acrylate, N-vinylpyrrolidone, acryloyl morpholine, methoxytetraethylene glycol acrylate, methoxypolyethylene glycol acrylate, polyethylene glycol diacrylate, N,N-dimethyl acrylamide, N-methylol acrylamide, N,N-dimethylaminopropyl acrylamide, N,N-dimethylaminoethyl acrylate, N,N-dimethylaminopropyl acrylate, melamine acrylate, diethylene glycol diacrylate, triethylene glycol diacrylate, propylene glycol diacrylate, dipropylene glycol diacrylate, tripropylene glycol diacrylate, polypropylene glycol diacrylate, phenoxyethyl acrylate, tetrahydrofurfuryl acrylate, cyclohexyl acrylate, glycerin diglycidyl ether diacrylate, glycerin triglycidyl ether triacrylate, isobornyl acrylate, cyclopentadiene mono- or di-acrylate; polyfunctional acrylates of polyhydric alcohols such as hexane diol, trimethylol propane, pentaerythritol, ditrimethylol propane, dipentaerythritol, and tris-hydroxyethyl isocyanurate and of ethylene oxide or propylene oxide adducts thereof; methacrylates corresponding to the acrylates enumerated above; and mono-, di-, tri-, and higher polyesters of polybasic acids with hydroxyalkyl (meth)acrylates.

Examples of the photopolymerization initiators or sensitizers include, but are not limited to: acetophenones such as acetophenone, 2,2-diethoxy-2-phenyl acetophenone, p-dimethylaminopropiophenone, dichloroacetophenone, trichloroacetophenone, p-tert-butyl trichloroacetophenone, 2-methyl-1-[4-(methylthio)phenyl]-2-morpholino-propan-1-one, and 2-benzyl-2-dimethylamino-1-(4-morpholinophenyl)-butan-1-one; benzophenones such as benzophenone, 2-chlorobenzophenone, p,p-dichlorobenzophenone, p,p-bis(dimethylamino) benzophenone, p,p-bis(diethylamino)benzophenone, and 4-benzoyl-4'-methyl-diphenyl sulfide; benzil; benzoin; benzoic ethers such as benzoin methyl ether, benzoin ethyl ether, benzoin isopropyl ether, and benzoin isobutyl ether; ketals such as benzyl dimethyl ketal; thioxanthones such as thioxanthone, 2-chlorothioxanthone, and 2,4-diethylthioxanthone; anthraquinones such as 2-ethylanthraquinone and 2,3-diphenylenthraquinone; organic peroxides such as benzoyl peroxide and cumene peroxide; thiol compounds such as dimer of 2,4,5-triaryl imidazole, riboflavin tetrabutylate, 2-mercaptobenzimidazole, 2-mercaptobenzoxazole, and 2-mercaptobenzothiazole; organic halogen compounds such as 2,4,6-tris-S-triazine,2,2,2-tribromoethanol, and tribromomethylphenyl sulfone; and 2,4,6-trimethylbenzoyl diphenyl phosphine oxide. These compounds may be used either singly or in the form of a combination of two or more members. The amount of the aforementioned photopolymerization initiator to be incorporated in the composition suitably falls in the range of 0.1 to 30 parts by weight, based on 100 parts by weight of the aforementioned photosensitive organic component (photosensitive prepolymer or photopolymerizable monomer).

The film-forming component mentioned above can be selected properly to suit the heat decomposable binder in the patterned film to be used. Properly, it has a burning-off point in the approximate range of 300–600° C., preferably 400–570° C., so as to be burned off by thermal decomposition during the course of calcination substantially simultaneously with the heat decomposable binder in the film. The term "burning-off point" as used herein means the temperature which exists when the per cent loss in weight of the organic component, excluding the solvent, reaches 95% as determined in the air at the temperature increasing rate of 5° C. /minute by the thermogravimetric analysis (TG/DTA). It is particularly favorable to use a film-forming component which is identical with or analogous (in pyrolytic behavior or chemical structure) to the heat decomposable binder. For instance, the film-forming component may have a burning-off point substantially equal to that of the heat decomposable binder.

The heat decomposable resin composition of the present invention, for the purpose of solving the film-forming component or adjusting the viscosity of the composition itself, allows the use therein of a varying organic solvent. As concrete examples of the organic solvent, ketones such as methylethyl ketone and cyclohexanone, aromatic hydrocarbons such as toluene, xylene, and tetramethyl benzene, glycol ethers such as diethylene glycol monoethyl ether and dipropylene glycol diethyl ether, esters such as ethyl acetate, butyl acetate, butyl cellosolve acetate, and carbitol acetate, aliphatic hydrocarbons such as octane and decane, and petroleum solvents such as petroleum ether, petroleum naphtha, and solvent naphtha may be cited. In terms of toxicity and coating properties, glycol ethers, esters, and petroleum solvents are used particularly favorably. For the purpose of avoiding abrupt vaporization of solvent during the course of removal of binder, it is advantageous to use a high boiling solvent among other organic solvents enumerated above.

Now, the method of the present invention will be described below by reference to the accompanying drawings which depict various modes of application of the method to the production of PDP.

Figure 3A:
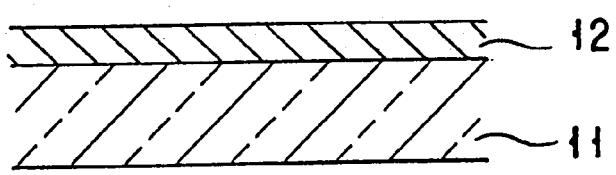
FIGS. 3A through 3E are fragmentary sectional side views for an explanation of process flow illustrating one embodiment of the method of the present invention.
Figure 3B:
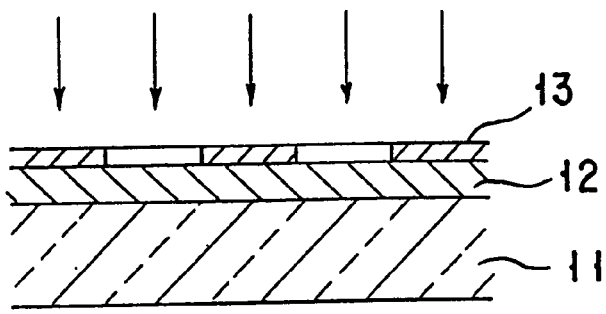
Figure 3C:
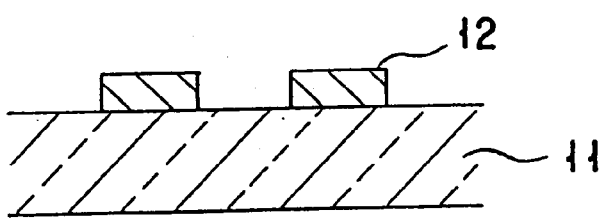

FIGS. 3A through 3E represent the mode using a photosensitive paste for the production of a calcined film. First, the photosensitive paste (conductive paste or insulating paste) is applied on such a transparent substrate 11 as glass substrate as illustrated in FIG. 3A and the applied layer of the paste is dried to produce a film 12 exhibiting good tack-free touch of finger. A photomask 13 containing a prescribed mask pattern is superposed on the film 12 and the film 12 is selectively exposed to light through the photomask 13 (FIG. 3B). After the removal of the photomask 13, the exposed film 12 is developed to remove the unexposed portions and assume the prescribed pattern (FIG. 3C). In this case, an organic solvent or an aqueous alkaline solution, for example, is used as the developing solution. When the photosensitive organic component of the photosensitive paste to be used herein contains a free carboxyl group, the development can be effected by using such an aqueous alkaline solution as sodium hydroxide, potassium hydroxide, sodium carbonate, potassium carbonate, sodium phosphate, sodium silicate, ammonia, or amine.

When the patterned film is formed by the printing method, such a patterned film 12 as illustrated in FIG. 3C is formed directly on the substrate by screen printing.

Figure 3D:
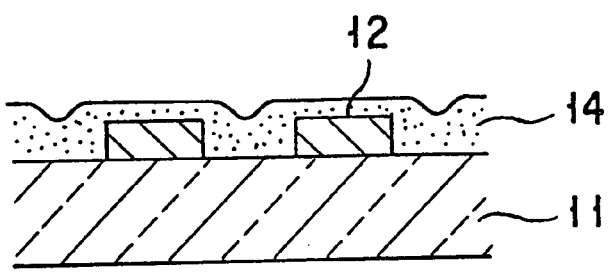
Figure 3E:
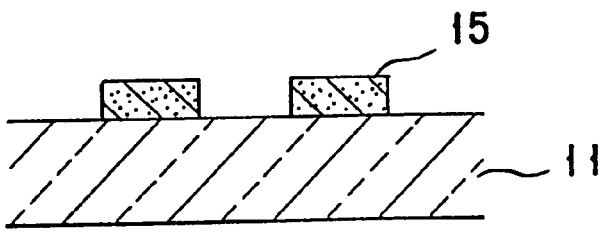

Thereafter, a heat decomposable resin composition is applied as illustrated in FIG. 3D to form a coating film 14 in such a manner as to cover the patterned film 12. Then, the superposed films are treated at a prescribed temperature, depending on the photosensitive paste used herein, to effect removal of the binder and calcination and consequently form on the substrate 11 a patterned calcined film 15 electroconducting film or insulating film) of the inorganic material as illustrated in FIG. 3E.

Figure 4A:
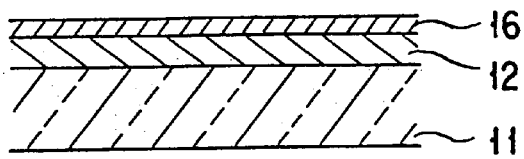
FIGS. 4A through 4G are fragmentary sectional side views for an explanation of process flow illustrating another embodiment of the method of the present invention.
Figure 4B:
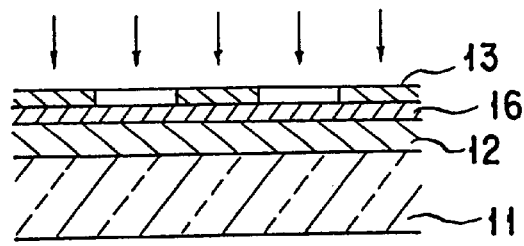
Figure 4C:
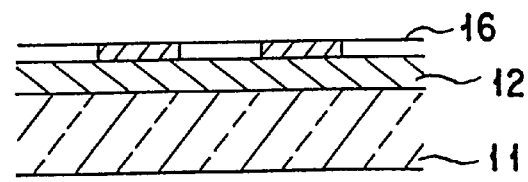

FIGS. 4A through 4G represent a process for the formation of a patterned calcined inorganic film by the sand blasting method. First, a photosensitive dry film 16 having the ability to resist blasting is laminated on the film 12 formed in advance by applying a pasty composition (conductive paste or insulating paste) on the substrate 11 as illustrated in FIG. 4A. Then, the photomask 13 containing the prescribed mask pattern is superposed on the dry film 16 and the dry film 16 is exposed to light through this photomask 13 (FIG. 4B). After the removal of the photomask 13, the substrate is subjected to development to remove the unexposed portions of the film 16 and obtain the patterned film 16 (FIG. 4C).

Figure 4D:
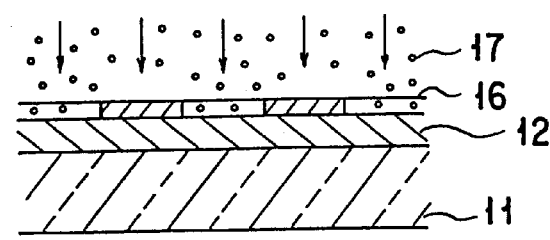
Figure 4E:
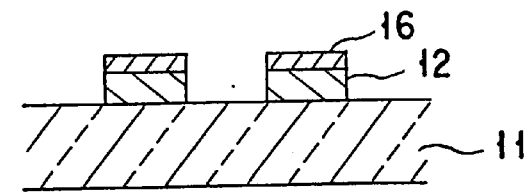

Subsequently, blast powder 17 is blown against the film 16 as illustrated in FIG. 4D to remove the bare portions of the film 12 as illustrated in FIG. 4E. Then, the dry film 16 is peeled and removed by the use of a remover. As the remover, an aqueous alkaline solution such as, for example, an aqueous roughly 1% NaOH solution kept at about 40° C. or an aqueous 10 wt. % monoethanol amine solution is used. The dry film 16 separates from the patterned film 12 immediately when it is immersed in this remover for a period in the approximate range of 30 seconds to five minutes and then washed with water.

Figure 4F:
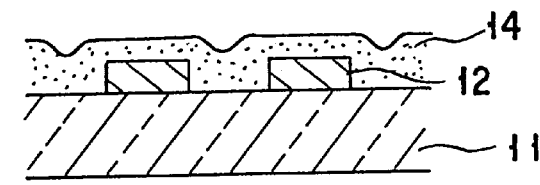
Figure 4G:
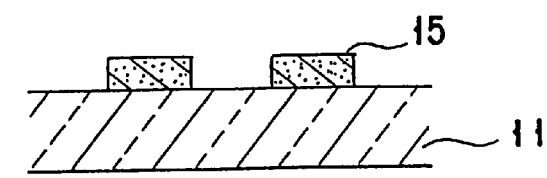

Thereafter, the heat decomposable resin composition is applied to form the coating film 14 in such a manner as to cover the patterned film 12 as illustrated in FIG. 4F. Then, the superposed films are treated at a prescribed temperature, depending on the pasty composition used herein, to effect removal of the binder and calcination and consequently form on the substrate 11 the patterned calcined film 15 (electroconducting film or insulating film) of the inorganic material as illustrated in FIG. 4G.

Figure 5A:
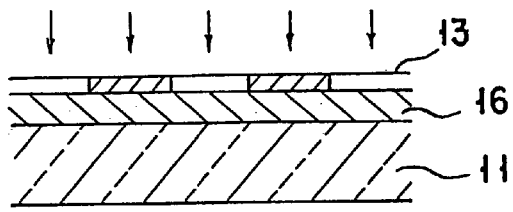
FIGS. 5A through 5G are fragmentary sectional side views for an explanation of process flow illustrating yet another embodiment of the method of the present invention.
Figure 5B:
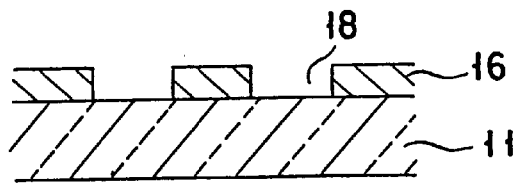

FIGS. 5A through 5G represent a process of forming a patterned calcined inorganic film by the lift-off method (dry film filling method). This process is suitable particularly for the formation of ribs of the PDP. First, the photosensitive dry film 16 of a prescribed thickness is laminated on the substrate 11 as illustrated in FIG. 5A. Then, the photomask 13 containing a prescribed mask pattern is superposed on the dry film 16. Thereafter, the film 16 is exposed to light and developed to remove the portions of the dry film 16 which has not been exposed to light through the photomask 13 as illustrated in FIG. 5B. When a transparent substrate having electrodes of a prescribed pattern formed in advance on the surface thereof is used, the photomask is superposed on the photosensitive dry film in such a manner that the pattern windows of the photomask are aligned with the positions of the electrodes.

Figure 5C:
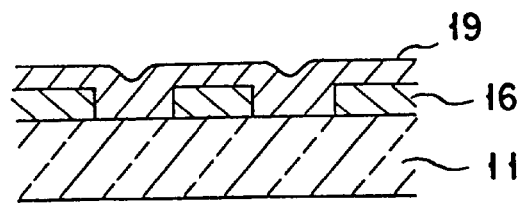
Figure 5D:
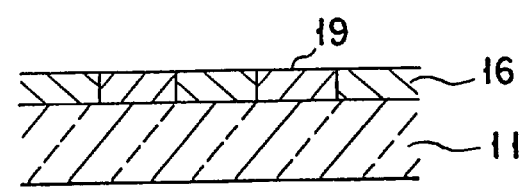

Subsequently, a pasty composition (electroconductive paste or insulating paste) 19 is applied to the patterned dry film 16 as illustrated in FIG. 5C so as to fill up grooves 18 between patterns of the dry film 16 which has been formed by the exposure to light and the development mentioned above. The applied layer of the composition is defoamed, preferably under reduced pressure, and then dried. Since this operation induces extinction of foam and. depression of the paste part as illustrated in FIG. 5C, the cycle of application—defoaming—drying of the paste is performed, when necessary, up to several repetitions. In this operation, the drying is desired to be carried out slowly lest the solvent in the pasty composition, on being volatilized, should leave residual bubbles behind in the composition. The drying operation is properly performed at about 80° C. for 30 minutes, for example, to ensure removal of bubbles. Thereafter, the paste is thermally cured at a temperature in the approximate range of 150° C. to 160° C. for 30 to 60 minutes. The cured hot paste is cooled and then the surface thereof is polished till the dry film 16 appears (FIG. 5D).

Figure 5E:
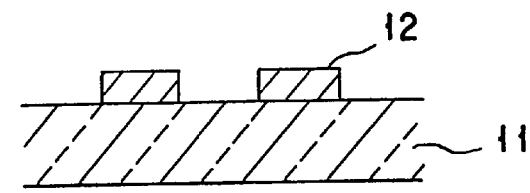

Subsequently, the dry film 16 is peeled and removed by the use of a remover to form on the substrate 11 the patterned film 12 in the prescribed pattern as illustrated in FIG. 5E. As the remover, an aqueous alkaline solution such as, for example, an aqueous 3–5% NaOH solution kept at 40° C. or an aqueous 10 wt. % monoethanol amine solution is used. The dry film 16 is swelled and separated from the substrate immediately when it is immersed in the remover for a period in the approximate range of 15 to 20 minutes and then immersed in water at a temperature in the neighborhood of 40° C. for some tens) of seconds.

Figure 5F:
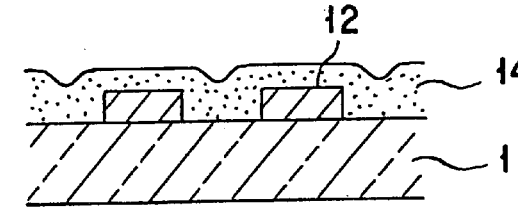
Figure 5G:
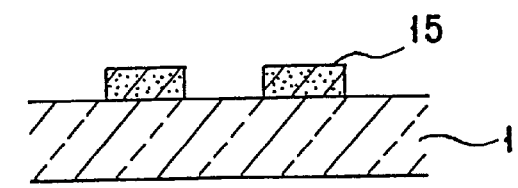

Thereafter, the heat decomposable resin composition is applied to form the coating film 14 in such a manner as to cover the patterned film 12 as illustrated in FIG. 5F. Then, the superposed films are treated at a prescribed temperature, depending on the photosensitive paste used herein, to effect removal of the binder and calcination and consequently form on the substrate 11 the patterned calcined film 15 (electroconducting film or insulating film) of the inorganic material as illustrated in FIG. 5G.

A liquid developable photosensitive resist may be used in the place of the photosensitive dry film used in the methods described above.

Now, the present invention will be described more specifically below with reference to working examples. Wherever "parts" and "%" are mentioned hereinbelow, they invariably refer to those based on weight unless otherwise specified.

The glass frit used in the following Examples and Comparative Examples was that obtained by grinding a glass composition containing 70% of PbO, 1.5% of $B_2O_3$, 23% of $SiO_2$, 1.5% of $Al_2O_3$, and 4% of BaO and having a softening point of 522° C. and an average particle diameter of 2.0 µm.

EXAMPLES 1–4

Silver paste I (one layer-grade silver paste)

| | |
|---|---|
| Resin (MMA—MA—GMA) | 100 parts |
| (a copolymer resin, Mw about 10,000, acid value 60 mg KOH/g, double bond equivalent about 1,000; obtained by adding 0.11 mol of glycidyl methacrylate (GMA) to a copolymer of methyl methacrylate (MMA) and methacrylic acid (MA) (MMA:MA in molar ratio = 0.77:0.23) | |
| Trimethylol propane triacrylate | 25 parts |
| 2-Methyl-1-[4-(methylthio)phenyl]-2-morpholino-propan-1-one) | 2.5 parts |
| (photopolymerization initiator manufactured by Ciba Specialty Chemicals Inc. and sold under the trademark designation of "Irgacure 907") | |
| Diethylene glycol n-butyl ether | 75 parts |
| Silver powder | 630 parts |
| Glass frit | 120 parts |
| Phosphorous acid | 1 part |

Preparation of Test Substrate

Step—1

The silver paste I of the composition shown above was applied to the top face of a glass substrate throughout the whole area by the use of a 300-mesh polester screen. Then, the applied layer of the silver paste was dried in a hot air circulating drying oven at 90° C. for 20 minutes to give a tack-free film. By using a negative film adapted to form a line/space of 70/90 µm and a metal halide lamp as a light source, the film was subsequently exposed to light till a calculated dose of 1,000 mJ/cm² on the film. Thereafter, the photocured film was developed with an aqueous 1 wt. % $Na_2CO_3$ solution of 30°C.

Step—2

On the patterned surface of the glass substrate which completed the step—1 mentioned above, a varying heat decomposable resin composition shown below was applied by printing throughout the entire area by the use of a 300-mesh polyester screen. Thereafter, in Example 1, by using a UV conveyor provided with a high pressure mercury vapor lamp as a light source, the applied layer of the composition was exposed to UV light and cured till a calculated dose of 1,000 mJ/cm² on the composition. In Examples 2–4, after the printing of the heat decomposable resin composition mentioned above, the applied layer thereof was dried in a hot air circulating drying oven at 90° C. for 20 minutes. The substrate manufactured under the foregoing conditions was calcined in a calcination profile comprising heating in the air till 450° C. at a temperature increasing rate of 10° C./minute, standing at rest at 450° C. for 20 minutes (for removal of the binder), heating again to 550° C. at a temperature increasing rate of 5° C./minute, heat treating in the air at 550° C. for 30 minutes, and allowing the substrate to fall to room temperature, to obtain the test substrate.

The resultant substrate was tested for various properties. The results are shown in Table 1. Even when the patterned layer of silver paste melted or suffered impairment of its adhesion to the substrate after the heat decomposable resin composition was applied to the substrate or dried, the exposure of the substrate performed up to the step—1 to UV light by the use of a UV conveyor provided with a high pressure mercury vapor lamp as a light source till a calculated dose of 2,000 mJ/cm² enabled the silver paste to retain a stable state after the heat decomposable resin composition was applied to the substrate or dried.

The heat decomposable resin compositions used herein were as shown below.

Heat decomposable resin composition A (burning-off point: about 540° C.)

| | |
|---|---|
| Trimethylol propane trimethacrylate | 100 parts |
| Photopolymerization initiator (manufactured by Merck Co. and sold under the trademark designation of "Darocure 1173") | 4 parts |

Heat decomposable resin composition B (burning-off point: about 520° C.)

| | |
|---|---|
| Resin (MMA—MA—GMA) | 55 parts |
| Diethylene glycol n-butyl ether | 45 parts |

Heat decomposable resin composition C (burning-off point: about 420° C.)

| | |
|---|---|
| Acrylic polycarboxylic acid | 50 parts |
| High boiling petroleum solvent (manufactured by Exxon Chemical K. K. and sold under the trademark designation of "Solvesso #200") | 50 parts |

Heat decomposable resin composition D (burning-off point: about 530° C.)

| | |
|---|---|
| Resin (MMA - MA - GMA) | 44 parts |
| Dipentaerythritol hexaacrylate | 16 parts |
| Trimethylol propane triacrylate | 2 parts |
| Irgacure 907 | 2 parts |
| Diethylene glycol n-butyl ether | 36 parts |

Comparative Example 1

A test substrate was manufactured by following the procedure of Example 1 while omitting the application of the heat decomposable resin composition by printing to the patterned film surface of the glass substrate performed up to the step—1. The resultant substrate was tested for various properties. The results are shown additionally in Table 1.

TABLE 1

| Run No. | | Heat decomposable resin composition | Curl | Shrinkage of line width |
|---|---|---|---|---|
| Example | 1 | A | ◎ | ◎ |
|  | 2 | B | ◎ | ○ |
|  | 3 | C | ○ | ○ |
|  | 4 | D | ◎ | ◎ |
| Comparative Example 1 | | — | x | x |

Remark
◎: Perfect absence of curl or shrinkage of line width
○: Slightly discernible curl or shrinkage of line width
x: Clearly discernible curl, shrinkage of line width, or breakage of lines The surface profile of the patterned film manufactured in Example 4 was measured by the use of a surface roughness meter. The surface profile is shown in FIGS. 6A through 6C.

Figure 6A:
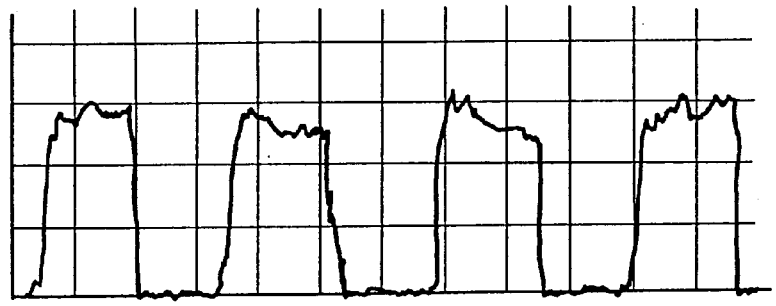
FIGS. 6A through 6C are graphs showing profiles of the surface of a film manufactured in Example 4 as produced by a surface roughness meter at various stages of the manufacture.
Figure 6B:
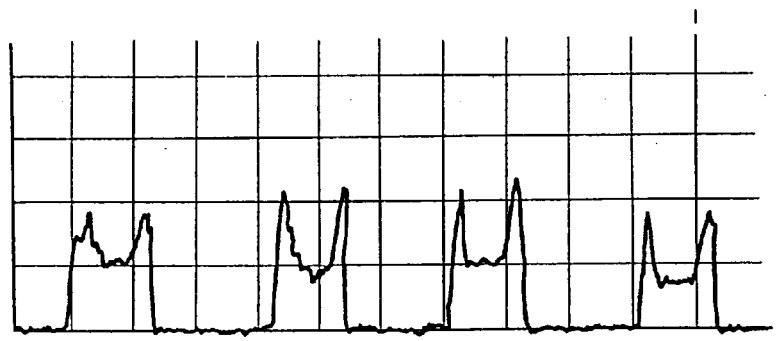
Figure 6C:

FIG. 6A depicts the state of the film (about 6–8 µm in thickness) after development, FIG. 6B the state of the film (about 2–2.5 µm in thickness) obtained after being calcined without being coated with the heat decomposable resin composition D, and FIG. 6C the state of the film (about 2–2.5 µm in thickness) obtained after being coated with the heat decomposable resin composition D and then calcined. It is clearly noted from FIG. 6B that the film, when obtained after being calcined without being coated with the heat decomposable resin composition, developed warpage and sustained shrinkage of line width to a considerable extent. Incidentally, the rugged line of the surface of the calcined film appearing in FIG. 6C reflects the fact that the calcined film had a microporous structure.

Examples 5–7

| Resin (MMA - MA - GMA) | 100 parts |
|---|---|
| Trimethylol propane triacrylate | 50 parts |
| Irgacure 907 | 15 parts |
| Diethylene glycol n-butyl ether | 75 parts |
| Silver powder | 150 parts |
| Glass frit | 25 parts |
| Black pigment | 100 parts |
| Phosphorous acid | 1 part |

Manufacture of test substrate
Step—1

The silver paste II of the composition shown above was applied to the top face of a glass substrate throughout the whole area by the use of a 300-mesh polyester screen similarly in Examples 1–4. Then, the applied layer of the silver paste was dried in a hot air circulating drying oven at 90° C. for 20 minutes to give a tack-free film. Subsequently, the silver paste I for the upper layer used in Examples 1–4 was applied by printing and dried under the same conditions as mentioned above to form a second layer. By using a negative film adapted to form a line/space of 70/90 µm and EL metal halide lamp as a light source, the superposed films were subsequently exposed to light till a calculated dose of 1,000 mJ/cm² on the films. Thereafter, the photocured films were developed with an aqueous 1 wt. % $Na_2CO_3$ solution of 30° C.

Step—2

On the patterned film surface of the glass substrate which completed the step—1 mentioned above, the varying heat decomposable resin composition shown above was applied by printing throughout the entire area by the use of a 300-mesh polyester screen. Thereafter, the resultant substrate was dried and calcined under the same conditions as in Examples 1–4 to produce the test substrate.

The resultant substrate was tested for various properties. The results are shown in Table 2. Even when the patterned layer of silver paste melted or suffered impairment of its adhesion to the substrate after the heat decomposable resin composition was applied to the substrate or dried, the exposure of the substrate performed up to the step—1 to UV light by the use of a UV conveyor provided with a high pressure mercury vapor lamp as a light source till a calculated dose of 2,000 mJ/cm² enabled the silver paste to retain a stable state after the heat decomposable resin composition was applied to the substrate or dried.

Comparative Example 2

A test substrate was manufactured by following the procedure of Example 5 while omitting the application of the heat decomposable resin composition by printing to the patterned film surface of the glass substrate performed up to the step—1. The resultant substrate was tested for various properties. The results are shown additionally in Table 2.

TABLE 2

| Run No. | | Heat decomposable resin composition | Curl | Shrinkage of line width |
|---|---|---|---|---|
| Example | 5 | B | ◎ | ○ |
|  | 6 | C | ○ | ○ |
|  | 7 | D | ◎ | ◎ |
| Comparative Example 2 | | — | x | x |

Remark: The symbols have the same meanings as defined above.

As evidenced above, since the method of the present invention, for the purpose of producing an electroconductive film or an insulating film (nonconductive film) by performing a calcining operation on a patterned film on a substrate, comprises covering the patterned film with a coating film of a heat decomposable resin composition prior to the calcining step mentioned above and thereafter performing the calcining step, it is capable of producing a patterned calcined inorganic film without inducing warpage, shrinkage of line width, or breakage of patterned lines.

The method of the present invention is useful for all the technical fields embracing the step of calcining a patterned film such as the formation of a circuit on a ceramic substrate, the manufacture of a photoelectric tube, the manufacture of an electroconductive film or an insulating film on the front substrate or the back substrate of a plasma display panel. In the production of the PDP particularly, this method can form finely patterned electroconducting films such as bus electrodes and address electrodes and insulating films of the ribs with high accuracy without inducing warpage or shrinkage of line width. When this method is used for the formation of a fluorescent film, it can produce the PDP of high quality because it precludes the occurrence of a crack in the fluorescent film.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. In a method for the production of a patterned calcined inorganic film by performing a calcining operation on a patterned film of a composition containing a heat decomposable binder and particles of an inorganic material, the improvement comprising:

prior to said calcining step, forming said patterned film on a glass substrate, and covering said patterned film with a coating film of a heat decomposable resin composition capable of hardening or drying at a temperature lower than the temperature at which said heat decomposable binder is thermally decomposed and further capable of being burned off at a temperature not more than the highest temperature of the calcining profile; and thereafter, calcining said patterned film and said coating film.

2. The method according to claim 1, wherein said heat decomposable resin composition contains a film-forming component identical with said heat decomposable binder.

3. The method according to claim 1, wherein said heat decomposable resin composition contains a film-forming component having a burning-off temperature substantially equal to a burning-off temperature of said heat decomposable binder.

4. The method according to claim 1, wherein said heat decomposable resin composition is a photocurable resin composition.

5. The method according to claim 1, wherein said heat decomposable resin composition is a drying resin composition.

6. The method according to claim 1, wherein said heat decomposable resin composition is a thermosetting resin composition.

7. The method according to claim 1, wherein said patterned film is an electroconducting film.

8. The method according to claim 1, wherein said patterned film is an insulating film.

9. The method according to claim 1, wherein said glass substrate is a sintered material.

10. The method according to claim 9, wherein said glass substrate is not further sintered as a result of said calcining step.

* * * * *